(12) United States Patent
Fu

(10) Patent No.: US 7,334,475 B1
(45) Date of Patent: Feb. 26, 2008

(54) MEMS ACTUATOR HAVING SUPPORTING SUBSTRATE ASSERTING PHYSICAL INFLUENCE ON OSCILLATING BODY

(75) Inventor: Yee-Chung Fu, Fremont, CA (US)

(73) Assignee: Advanced NuMicro Systems, Inc., San Jose, CA (US)

( * ) Notice: Subject to any disclaimer, the term of this patent is extended or adjusted under 35 U.S.C. 154(b) by 14 days.

(21) Appl. No.: 11/367,104

(22) Filed: Mar. 3, 2006

(51) Int. Cl.
*G01P 15/08* (2006.01)
*G01P 15/00* (2006.01)

(52) U.S. Cl. .................... 73/514.29; 73/514.38

(58) Field of Classification Search ........... 73/514.32, 73/514.16, 514.29, 514.36, 514.38, 504.04, 73/504.12, 504.14, 504.15, 504.16
See application file for complete search history.

(56) References Cited

U.S. PATENT DOCUMENTS

| 6,595,055 | B1 | 7/2003 | Schenk et al. | |
|---|---|---|---|---|
| 7,155,976 | B2 * | 1/2007 | Kai-Cheng et al. | 73/504.04 |

OTHER PUBLICATIONS

William C. Tang et al., "Electrostatic Comb Drive Levitation and Control Method," Journal of Microelectromechanical Systems, vol. 1, No. 4, Dec. 1992, pp. 170-178.

* cited by examiner

*Primary Examiner*—Helen Kwok
(74) *Attorney, Agent, or Firm*—Patent Law Group LLP; David C. Hsia

(57) ABSTRACT

A micro-electro-mechanical system (MEMS) device includes an oscillating body and a beam connected to the oscillating body. The beam has a proximal end connected to the oscillating body, a distal end spaced from the oscillating body, and rotational comb teeth extending from the beam. Springs couple the beam to stationary pads to allow the oscillating body to rotate about a rotational axis. The springs are arranged along the rotation axis so at least one spring is located between another spring and the oscillating body. Stationary comb teeth extend from a stationary pad to be interdigitated with the rotational comb teeth extending from the beam. A voltage difference is applied between the stationary and rotational comb teeth to rotate the oscillating body about the rotation axis. A bottom layer includes mounting pads for supporting the stationary pads. An electrode is formed on a surface of the bottom layer. A voltage or ground is applied to the electrode to assert a physical influence on the rotation of the oscillating body.

15 Claims, 3 Drawing Sheets

MEMS ACTUATOR HAVING SUPPORTING SUBSTRATE ASSERTING PHYSICAL INFLUENCE ON OSCILLATING BODY

FIELD OF INVENTION

This invention relates to micro-electro-mechanical system (MEMS) devices, and more particularly to MEMS actuators.

DESCRIPTION OF RELATED ART

U.S. Pat. No. 6,595,055 discloses a micromechanical component having a frame layer and an oscillating body suspended in an opening in the frame layer. At least one lateral surface of the oscillating body is arranged in relation to at least one inner lateral surface of the opening so that a capacitance formed between them is varied by an oscillation of the oscillating body. This allows the oscillating body to be oscillated by periodically varying a voltage applied between the frame layer and the oscillating body.

The frame layer is mounted on a supporting substrate. The supporting substrate is implemented so that, in comparison to the influence of the voltage applied between the frame layer and the oscillating body, the supporting substrate has a negligible physical influence on the oscillation of the oscillating body.

SUMMARY

In one embodiment of the invention, a micro-electro-mechanical system (MEMS) device includes an oscillating body and a beam connected to the oscillating body. The beam has a proximal end connected to the oscillating body, a distal end spaced from the oscillating body, and rotational comb teeth extending from the beam. Springs couple the beam to stationary pads to allow the oscillating body to rotate about a rotational axis. The springs are arranged along the rotation axis so at least one spring is located between another spring and the oscillating body. Stationary comb teeth extend from a stationary pad to be interdigitated with the rotational comb teeth extending from the beam. A voltage difference is applied between the stationary and rotational comb teeth to rotate the oscillating body about the rotation axis. A bottom layer includes mounting pads for supporting the stationary pads. An electrode is formed on a surface of the bottom layer. A voltage or ground is applied to the electrode to assert a physical influence on the rotation of the oscillating body.

BRIEF DESCRIPTION OF THE DRAWINGS

Use of the same reference numbers in different figures indicates similar or identical elements.

DETAILED DESCRIPTION OF THE INVENTION

Figure 1:
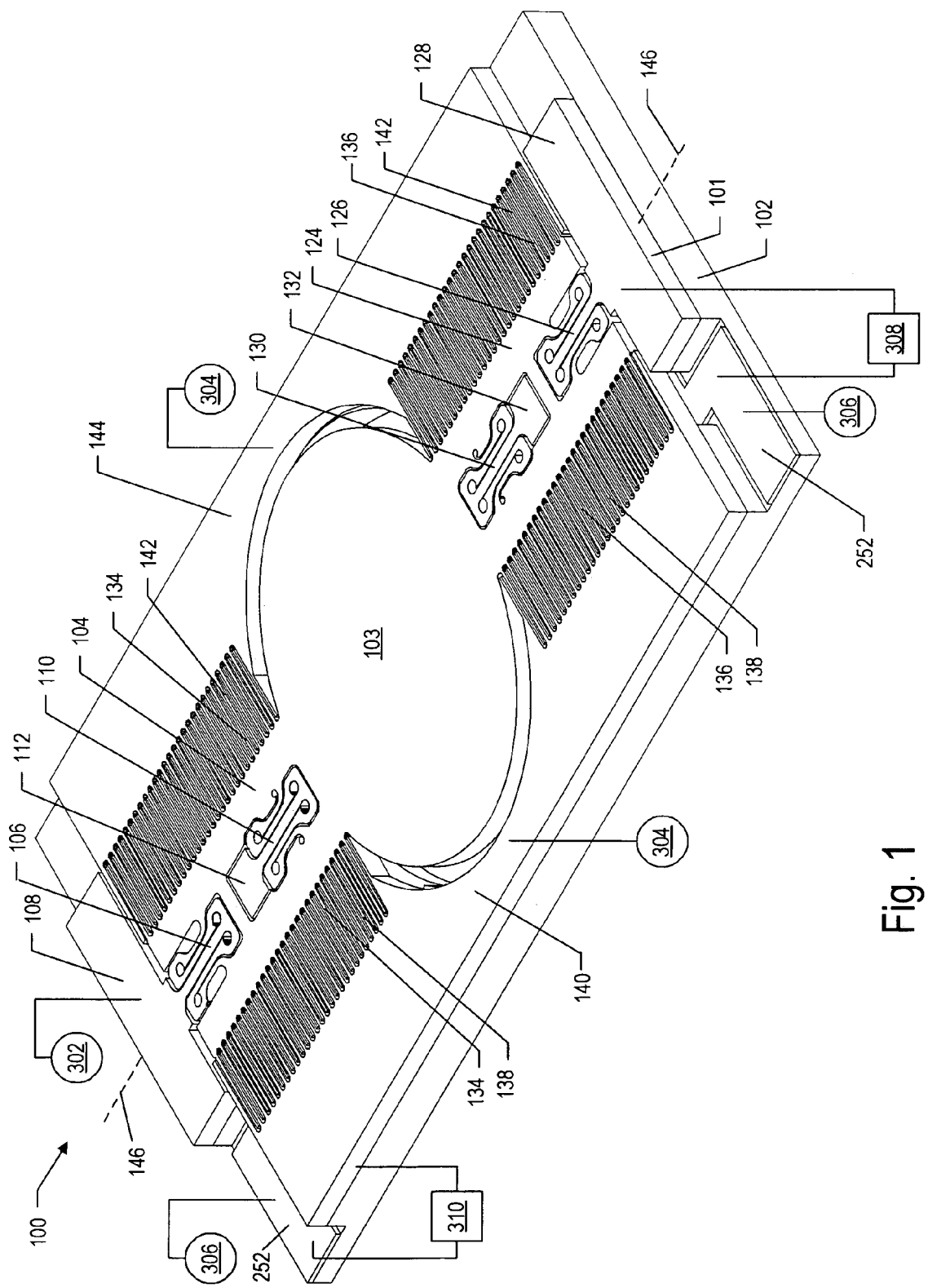
FIG. 1 illustrates a MEMS device in one embodiment of the invention.

FIG. 1 illustrates a MEMS device 100 in one embodiment of the invention. Device 100 includes a top layer 101 mounted on a bottom layer 102. If bottom layer 102 is conductive, then an insulating layer (not shown) is located between layers 101 and 102.

Top layer 101 includes an oscillating body 103 having a first half connected to a proximal end of a beam 104. A distal end of beam 104 extends away from oscillating body 103 and is coupled by a spring 106 to a stationary pad 108. Beam 104 is further coupled by a spring 110 to a stationary pad 112. In one embodiment, spring 110 and stationary pad 112 are located in an opening in beam 104. Each spring can be a straight-shaped spring, a U-shaped spring, or a serpentine-shaped spring. In one embodiment, each spring has two serpentine sections and a straight section. Each serpentine section has one end joined to beam 104 and another end joined at the middle with the straight section, which in turn is joined a respective stationary pad.

Oscillating body 103 has a second half coupled to a proximal end of a beam 124. A distal end of beam 124 extends away from oscillating body 103 and is coupled by a spring 126 to a stationary pad 128. Beam 124 is further coupled by a spring 130 to a stationary pad 132. In one embodiment, spring 130 and stationary pad 132 are located in an opening in beam 124. Springs 126 and 130 may have the same construction as springs 106 and 110.

Springs 106, 110, 126, and 130 are arranged so their rotational axes are aligned along a rotational axis 146 of oscillating body 103. This allows oscillating body to rotate about rotational axis 146.

Rotational comb teeth 134 extend from both sides of beam 104 while rotational comb teeth 136 extend from both side of beam 124. On one side of rotational axis 146, rotational comb teeth 134 and 136 are interdigitated with stationary comb teeth 138 extending from a stationary pad 140 facing a first side of beams 104 and 124. On the other side of rotational axis 146, rotational comb teeth 134 and 136 are interdigitated with stationary comb teeth 142 extending from a stationary pad 144 facing a second side of beams 104 and 124. The rotational and the stationary comb teeth form an actuator that rotates oscillating body 103 along rotation axis 146 when a voltage difference is applied between the rotational and the stationary comb teeth. Typically a varying voltage difference is applied between the rotational and the stationary comb teeth to oscillate oscillating body 103.

In one embodiment, the above components are formed by etching top layer 101. Note that oscillating body 103 corresponds to the oscillating body in U.S. Pat. No. 6,595,055, rotational comb teeth 134 and 136 correspond to the lateral surface of the oscillating body in U.S. Pat. No. 6,595,055, and stationary comb teeth 138 and 142 correspond to inner lateral surface of the opening in U.S. Pat. No. 6,595,055.

Although each beam is shown to be connected by two springs to two stationary pads, additional springs can be added along rotation axis 146 to connect the beam to additional stationary pads.

Figure 2:
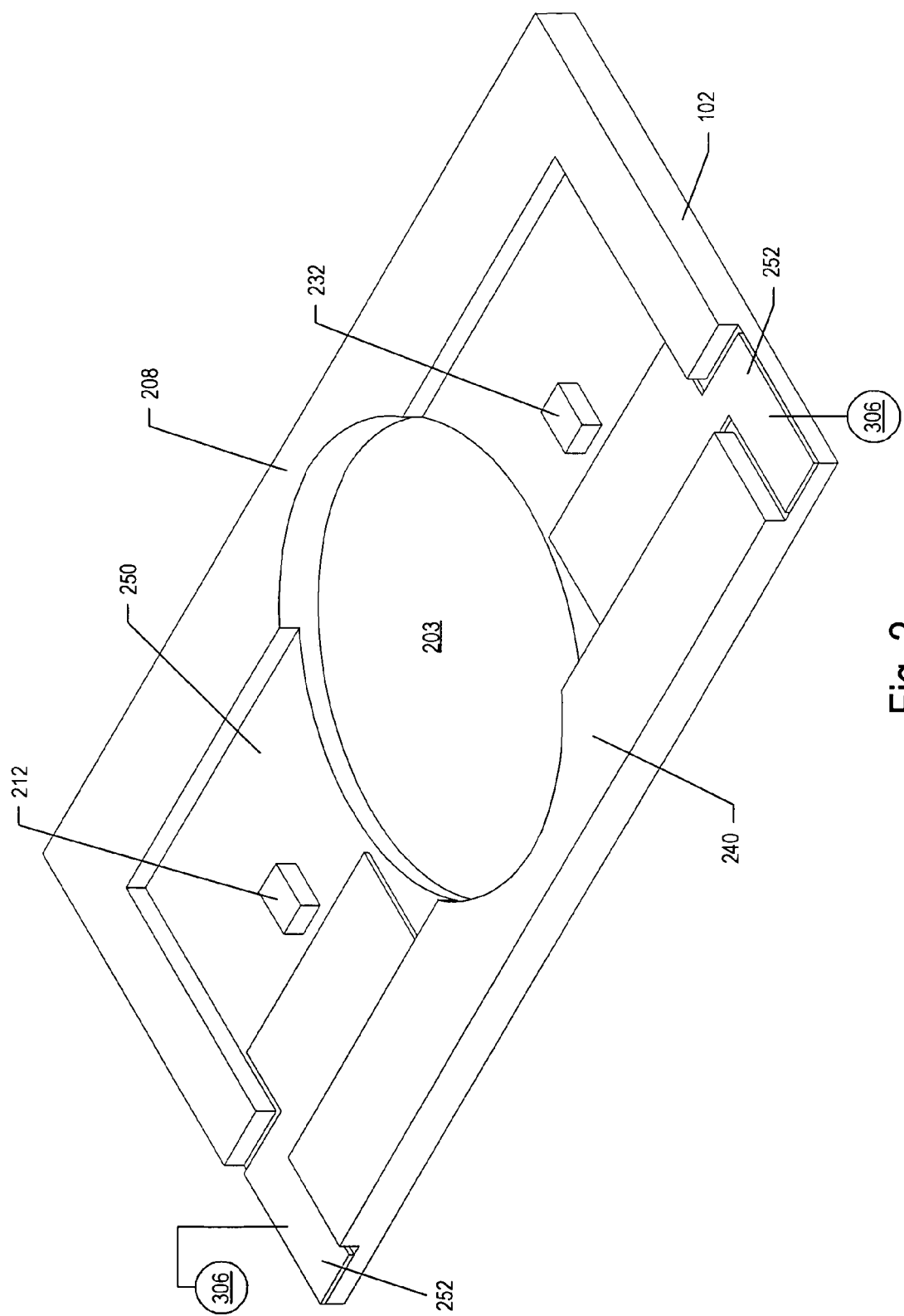
FIG. 2 illustrates a bottom layer of the MEMS device of FIG. 1 in one embodiment of the invention.

FIG. 2 illustrates bottom layer 102 in one embodiment of the invention. Bottom layer 102 defines an opening 203 to accommodate the motion of oscillating body 103 (FIG. 1). Bottom layer 102 includes a U-shaped mounting pad 208 for supporting stationary pads 108, 128, and 144 (FIG. 1), a square mounting pad 212 for supporting stationary pad 112 (FIG. 1), a square mounting pad 232 for supporting stationary pad 132 (FIG. 1), and a rectangular mounting pad 240 for supporting stationary pad 140 (FIG. 1). In one embodiment, opening 203 is formed by etching through bottom layer 102, and mounting pads 208, 212, 232, and 240 are formed by etching bottom layer 102 down to a surface 250.

Bottom layer 102 further includes one or more electrodes 252 formed on surface 250. A voltage or ground is applied to electrodes 252 so that voltage difference between (1) electrodes 252 and (2) the rotational or the stationary comb teeth from top layer 101 (FIG. 1) physically influences the rotation of oscillating body 103 (FIG. 1). In one embodiment, electrodes 252 are metal layers deposited on surface 250. If bottom layer 102 is conductive, then an insulating layer (not shown) is located between electrodes 252 and surface 250. In one embodiment, electrodes 252 are located only on one side of axis 146 (FIG. 1) below stationary comb teeth 138.

In one embodiment, electrodes 252 disturb the symmetry of the electrical field around oscillating body 103. This allows oscillating body 103 (FIG. 1) to initially rotate to one side and then start to oscillate when a varying voltage difference is applied between the rotational and the stationary comb teeth.

In one embodiment, electrodes 252 are used to sense the rotational angle and the direction of rotation of oscillating body 103 (FIG. 1). A capacitance sensor is coupled to electrodes 252 to measure voltage or current variation between (1) electrodes 252 and (2) the stationary or the rotational comb teeth. The voltage or current variation is then correlated to the rotational angle and the rotation direction of the oscillating body.

The operation of device 100 is explained in reference to FIG. 1. To start the oscillation of oscillating body 103, voltage sources 306 supply a steady voltage (a voltage or ground) to electrodes 252. A voltage source 302 then supplies a varying voltage to rotational comb teeth 134 and 136 while voltage sources 304 supply a steady voltage (a voltage or ground) to stationary comb teeth 138 and 142. Alternatively, voltage source 302 supplies a steady voltage (a voltage or ground) to rotational comb teeth 134 and 136 while voltage sources 304 supply varying voltages (in phase or out of phase) to stationary comb teeth 138 and 142

To determine the rotational angle and the rotation direction of oscillating body, a capacitance sensor 308 is coupled between one electrode 252 and rotational comb teeth 136. Alternatively, a capacitance sensor 310 is coupled between one electrode 252 and stationary comb teeth 138.

Figure 3:
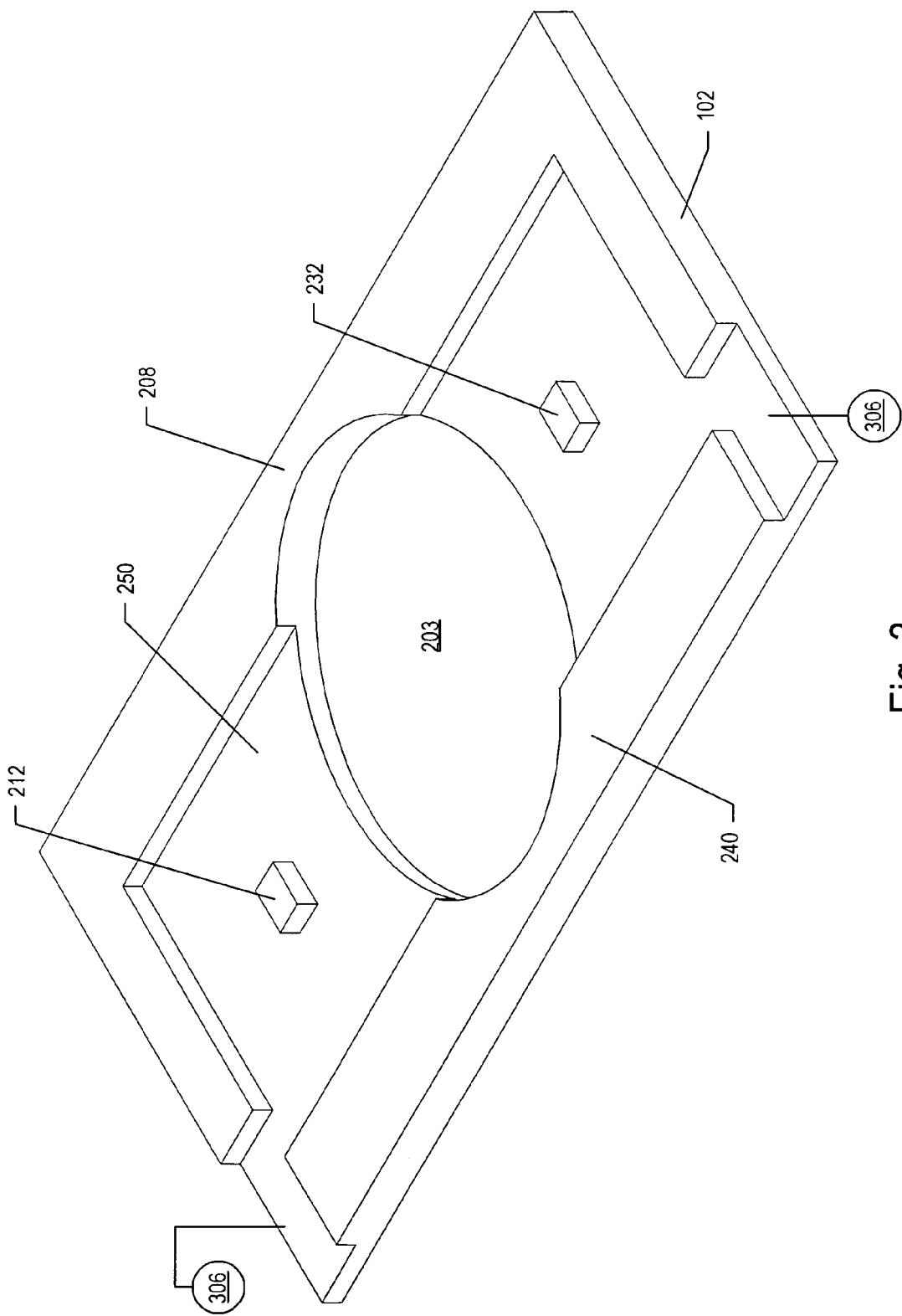
FIG. 3 illustrates a bottom layer of the MEMS device of FIG. 1 in another embodiment of the invention.

FIG. 3 illustrates an alternative embodiment where bottom layer 102 is conductive, electrodes 252 and its insulation layer are removed, and voltage source 306 is connected to bottom layer 102. In addition, capacitive sensor 308 or 310 is coupled between (1) the bottom lay 102 and (2) the rotational or the stationary comb teeth of top layer 101 (FIG. 1). In this embodiment, a voltage difference between (1) surface 250 of bottom layer 102 and (2) the rotational or the stationary comb teeth of top layer 101 physically influences the rotation of oscillating body 103 (FIG. 1). Similar to electrodes 252, surface 250 may be used to initiate oscillation of oscillating body 103 or sense the rotational angle and the rotational direction of oscillating body 103.

Various other adaptations and combinations of features of the embodiments disclosed are within the scope of the invention. Numerous embodiments are encompassed by the following claims.

What is claimed is:

1. A micro-electro-mechanical system (MEMS) device, comprising:
   an oscillating body;
   a beam, comprising:
      a proximal end connected to the oscillating body;
      a distal end extending away from the oscillating body; and
      a plurality of rotational comb teeth extending from the beam;
   a plurality of springs coupling the beam to a plurality of stationary pads, wherein the plurality of springs are aligned along a rotational axis and at least one spring is between another spring and the oscillating body;
   a stationary pad comprising a plurality of stationary comb teeth interdigitated with the plurality of rotational comb teeth, wherein a voltage difference causes a rotation of the oscillating body about the rotational axis; and
   a bottom layer, comprising:
      a plurality of mounting pads for supporting the stationary pad and the plurality of stationary pads; and
      an electrode asserting a physical influence on the rotation of the oscillating body.

2. The MEMS device of claim 1, further comprising a first voltage source coupled to the rotational comb teeth, a second voltage source coupled to the stationary comb teeth, and a third voltage source coupled to the electrode.

3. The MEMS device of claim 1, further comprising a first voltage source coupled to the rotational comb teeth, a second voltage source coupled to the stationary comb teeth, and a sensor between the electrode and one of the rotational comb teeth and the stationary comb teeth.

4. The MEMS device of claim 3, wherein the sensor measures at least one of a current and a voltage for determining at least one of a rotational angle and a rotational direction of the oscillating body.

5. The MEMS device of claim 1, wherein the electrode comprises a metal layer formed on the bottom layer.

6. The MEMS device of claim 1, wherein the plurality of springs is selected from the group consisting of straight-shaped springs, U-shaped springs, and serpentine-shaped springs.

7. The MEMS device of claim 1, wherein the plurality of spring elements each comprises:
   a straight section, wherein a first end of the straight section is connected to a respective stationary pad; and
   a plurality of serpentine sections, wherein first ends of the serpentine sections are connected to a second end of the straight section, and second ends of the serpentine sections are connected to the beam.

8. The MEMS device of claim 1, further comprising:
   another beam, comprising:
      another proximal end connected to the oscillating body;
      another distal end spaced from the oscillating body; and
      another plurality of rotational comb teeth extending from said another beam, said another plurality of rotational comb teeth being interdigitated with the plurality of stationary comb teeth;
   another plurality of springs coupling said another beam to another plurality of stationary pads, wherein said another plurality of springs are aligned along the rotational axis and at least one spring is between another spring and the oscillating body;
   wherein the plurality of mounting pads of the bottom layer further supports said another plurality of stationary pads.

9. A micro-electro-mechanical system (MEMS) device, comprising:
   an oscillating body;
   a beam, comprising:
      a proximal end connected to the oscillating body;
      a distal end extending away from the oscillating body; and
      a plurality of rotational comb teeth extending from the beam;

a plurality of springs coupling the beam to a plurality of stationary pads, wherein the plurality of springs are aligned along a rotational axis and at least one spring is between another spring and the oscillating body;

a stationary pad comprising a plurality of stationary comb teeth interdigitated with the plurality of rotational comb teeth, wherein a voltage difference causes a rotation of the oscillating body about the rotational axis; and a conductive bottom layer, comprising:
- a plurality of mounting pads for supporting the stationary pad and the plurality of stationary pads; and
- a surface asserting a physical influence on the rotation of the oscillating body.

10. The MEMS device of claim 9, further comprising a first voltage source coupled to the rotational comb teeth, a second voltage source coupled to the stationary comb teeth, and a third voltage source coupled to the conductive bottom layer.

11. The MEMS device of claim 9, further comprising a first voltage source coupled to the rotational comb teeth, a second voltage source coupled to the stationary comb teeth, and a sensor between the conductive bottom layer and one of the rotational comb teeth and the stationary comb teeth.

12. The MEMS device of claim 11, wherein the sensor measures at least one of a current and a voltage for determining at least one of a rotational angle and a rotational direction of the oscillating body.

13. The MEMS device of claim 9, wherein the plurality of springs is selected from the group consisting of straight-shaped springs, U-shaped springs, and serpentine-shaped springs.

14. The MEMS device of claim 9, wherein the plurality of spring elements each comprises:

a straight section, wherein a first end of the straight section is connected to a respective stationary pad; and a plurality of serpentine sections, wherein first ends of the serpentine sections are connected to a second end of the straight section, and second ends of the serpentine sections are connected to the beam.

15. The MEMS device of claim 9, further comprising:

another beam, comprising:

another proximal end connected to the oscillating body;

another distal end spaced from the oscillating body; and another plurality of rotational comb teeth extending from said another beam, said another plurality of rotational comb teeth being interdigitated with the plurality of stationary comb teeth;

another plurality of springs coupling said another beam to another plurality of stationary pads, wherein said another plurality of springs are aligned along the rotational axis and at least one spring is between another spring and the oscillating body;

wherein the plurality of mounting pads of the conductive bottom layer further supports said another plurality of stationary pads.

* * * * *